United States Patent
Jaenker

[19]

[11] Patent Number: 5,986,386
[45] Date of Patent: Nov. 16, 1999

[54] ELECTROSTRICTIVE OR PIEZOELECTRIC ACTUATOR DEVICE

[75] Inventor: Peter Jaenker, Garching, Germany

[73] Assignee: DaimlerChrysler AG, Stuttgart, Germany

[21] Appl. No.: 09/146,266

[22] Filed: Sep. 3, 1998

[30] Foreign Application Priority Data

Sep. 3, 1997 [DE] Germany ............................ 197 38 407

[51] Int. Cl.$^6$ .................................................. H01L 41/08
[52] U.S. Cl. ............................................ 310/340; 310/346
[58] Field of Search ..................................... 310/328, 346, 310/366

[56] References Cited

U.S. PATENT DOCUMENTS

| | | | |
|---|---|---|---|
| 3,349,259 | 10/1967 | Kistler ....................................... | 310/338 |
| 5,059,850 | 10/1991 | Yoshimura et al. ..................... | 310/328 |
| 5,111,101 | 5/1992 | Imoto ....................................... | 310/328 |
| 5,126,618 | 6/1992 | Takahashi et al. .................. | 310/328 X |
| 5,266,862 | 11/1993 | Ohya ........................................ | 310/328 |
| 5,438,232 | 8/1995 | Inoue et al. ............................. | 310/328 |

FOREIGN PATENT DOCUMENTS 1226186  9/1989  Japan .

*Primary Examiner*—Mark O. Budd
*Attorney, Agent, or Firm*—W. F. Fasse; W. G. Fasse

[57] ABSTRACT

An electrostrictive or piezoelectric actuator device includes a solid state actuator element (4) that is elongated in the lengthwise direction (L) and contracted in the transverse direction (T) upon application of an electric voltage thereto. The actuator element (4) is clampingly held between a housing floor and an actuator output pin (6) in a housing (2). A protective interlayer (12) is respectively arranged between the lengthwise end faces of the actuator element (4) and the housing floor and the actuator pin respectively, to protect the actuator element against transverse stress peaks. The interlayer (12) provides a soft or elastic coupling in the transverse direction and a substantially rigid, force and stroke transmitting coupling in the lengthwise direction. To achieve this, each interlayer (12) is made of a material having an anisotropic modulus of elasticity with a lengthwise stiffness that is considerably higher than that of the solid state material of the actuator element and a transverse stiffness that is less than that of the solid state material of the actuator element.

20 Claims, 1 Drawing Sheet

U.S. Patent Nov. 16, 1999 5,986,386 ns
ELECTROSTRICTIVE OR PIEZOELECTRIC ACTUATOR DEVICE

PRIORITY CLAIM

This application is based on and claims the priority under 35 U.S.C. §119 of German Patent Application 197 38 407.2, filed on Sep. 3, 1997. The entire disclosure of German Patent Application 197 38 407.2 is incorporated herein by reference.

FIELD OF THE INVENTION

The invention relates to an electrostrictive or piezoelectric actuator device including a solid state element, such as a piezoelectric member, as an actuator that has a variable length responsive to an applied electrical voltage. The actuator is clampingly held at its ends in the device in a force transmitting manner. In order to provide protection against transverse load peaks, a respective protective interlayer is arranged between each end of the actuator and the corresponding clamping portion of the device body.

BACKGROUND INFORMATION

Actuator devices of the above mentioned type typically include a solid state electrostrictive or piezoelectric laminated element as an actuator, which becomes elongated in a lengthwise direction and which contracts in a crosswise or transverse direction, upon application of an electrical voltage to the solid state element. This description will generally refer to piezoelectric materials for the actuator element as an example, but applies equally to electrostrictive materials.

Such actuator devices are characterized by a relatively high actuating speed, a high force application, and a high resolution. However, since such solid state actuators are extremely sensitive to tensile loading, i.e. they have a relatively low effective tensile strength, it has been found that they should be arranged in such a manner that the solid state element is pre-compressed in the lengthwise direction by a pre-loading spring. This is especially the case in applications requiring rapid actuation switching.

Furthermore, the respective end faces of the solid state (e.g. piezoelectric) laminated actuator element are coupled to the other components of the device, such as the actuator pin and the housing or frame, so as to transmit the elongation force and travel from the actuator element to the actuator pin relative to the housing. Such coupling, if direct, causes a problem as follows. The tendency of the solid state laminated actuator element to contract in a transverse direction upon being energized is constrained at its end faces, due to the coupling of the end faces to the actuator pin and housing, which do not contract. If no protective measures are provided, the transverse constraining effect results in excessive transverse tensile loads and shear stresses in the laminated actuator element, near the lengthwise ends thereof.

One attempt to avoid the above mentioned transverse tensile stresses has been to arrange a protective interlayer of homogeneous soft elastic material between each end face of the laminated actuator element and the adjoining solid component of the device. In this manner, the coupling between the actuator element and the solid components of the device is intended to be somewhat yielding in the transverse direction, in order to provide protection against excessive transverse tensile loads arising at the end faces of the actuator element due to the transverse contraction thereof. However, such an elastic interlayer also reduces the mechanical stiffness and positive coupling of the force transmission chain, so that at least a portion of the lengthwise piezoelectric elongation is lost or wasted in the compression or deformation of the soft elastic material of the interlayer, and only a limited portion of the piezoelectric elongation is available for the useful actuation motion. This is especially true because the piezoelectric elongation is typically characterized by a high force and relatively short travel.

Japanese Patent Publication 1-226186 describes another attempt to overcome the above mentioned problem of transverse tensile loading and resulting shear stresses. According to this reference, the outermost layers of the laminated piezoelectric element are made of a piezoelectric material that has a smaller transverse voltage strain constant than does the piezoelectric material of the rest of the laminated piezoelectric element. Thereby, the outermost piezoelectric layers act as stress moderating layers, because they will tend to exhibit a contraction strain that is less than, and particularly only one half of, the transverse contraction of the rest of the laminated piezoelectric element. However, the end faces of the laminated piezoelectric element apparently remain rigidly coupled to the rest of the actuator device, e.g. the actuator pin and the housing. Thus, the arrangement according to Japanese Patent Publication 1-226186 still suffers an abrupt peak in the transverse tension at the rigid or fixed junction between the piezoelectric element and the rest of the actuator device, which results in undesirably high transverse tensile loads on the end faces forming the junction surfaces of the outermost piezoelectric layers.

SUMMARY OF THE INVENTION

In view of the above, it is an object of the invention to provide an electrostrictive or piezoelectric actuator device of the above mentioned general type, wherein the solid state actuator element is effectively protected against local transverse tensile loading peaks at its force transmitting end faces in a manner that does not dissipate or waste a substantial portion of the available lengthwise actuation stroke. Particularly, the invention aims to provide an arrangement in which the end faces of the laminated actuator element have a softer or reduced transverse coupling while maintaining a substantially rigid longitudinal or lengthwise coupling to the other components of the actuator device. The invention further aims to avoid or overcome the disadvantages of the prior art, and to achieve additional advantages, as apparent from the present description.

The above objects have been achieved in an electrostrictive or piezoelectric actuator device according to the invention, including an actuator device body and a solid state actuator element arranged with its end faces coupled in a force transmitting manner to the actuator device body. Particularly according to the invention, a protective interlayer is arranged between at least one end face of the solid state actuator element and the corresponding adjoining part of the actuator device body, wherein the protective interlayer comprises a material having an anisotropic modulus of elasticity with a relatively higher material stiffness in the actuator lengthwise direction, and a relatively lower material stiffness in the actuator transverse direction. Especially, the above mentioned stiffnesses are in comparison to the piezoelectric or electrostrictive material of the solid state actuator, as well as relative to each other, so that the stiffness of the solid state material lies between the transverse stiffness and the lengthwise stiffness of the interlayer. It should be understood herein that the term "stiffness" refers to the respective value of the modulus of elasticity.

The actuator device according to the invention achieves a highly stiff and rigid coupling of the solid state actuator element with respect to the lengthwise elongation motion, but a relatively soft or elastic coupling of the solid state actuator element with respect to the transverse contraction. This is achieved in a simple manner by means of the special embodiment of the protective interlayer comprising an anisotropic material having a modulus of elasticity that is substantially higher than that of the solid state actuator material in the actuator lengthwise direction, but that is lower than that of the solid state actuator material in a transverse direction. In this manner, the high elongation forces are transmitted through the protective interlayer essentially without stroke travel losses, while simultaneously, critical transverse tensile loads that are necessarily caused by the clampingly held arrangement on the end contact faces of the actuator element are effectively eliminated, and thereby the risk of a mechanical failure of the actuator element is significantly reduced.

According an embodiment of the invention that is particularly advantageous in view of production of the inventive device and in view of achieving the necessary anisotropic stiffness characteristic, the protective interlayer is preferably made of a fiber-reinforced composite material having fibers with a unidirectional fiber orientation in the actuator lengthwise direction, embedded in any known matrix, such as a resin matrix or even a metal or ceramic matrix. Particularly, the fiber-reinforced composite material advantageously consists of carbon fiber composite material, wherein the ratio of the lengthwise stiffness to the transverse stiffness of the interlayer is preferably at least 10, and more preferably at least 50 or even greater than 50. Furthermore, the stiffness of the solid state actuator material is preferably approximately proportionally between, e.g. approximately (±10%) equal to the geometric mean of, the stiffness values of the protective interlayer.

Further advantageously according to the invention, the solid state actuator element comprises a stack of piezoelectric material layers forming a laminated piezoelectric element, whereby the protective interlayer is embodied as a solid pressure plate that surfacially contacts and adjoins the respective end face of the stack of piezoelectric layers.

BRIEF DESCRIPTION OF THE DRAWINGS

In order that the invention may be clearly understood, it will now be described in connection with an example embodiment, with reference to the accompanying drawings, wherein.

DETAILED DESCRIPTION OF PREFERRED EXAMPLE EMBODIMENTS AND OF THE BEST MODE OF THE INVENTION

Figure 1:
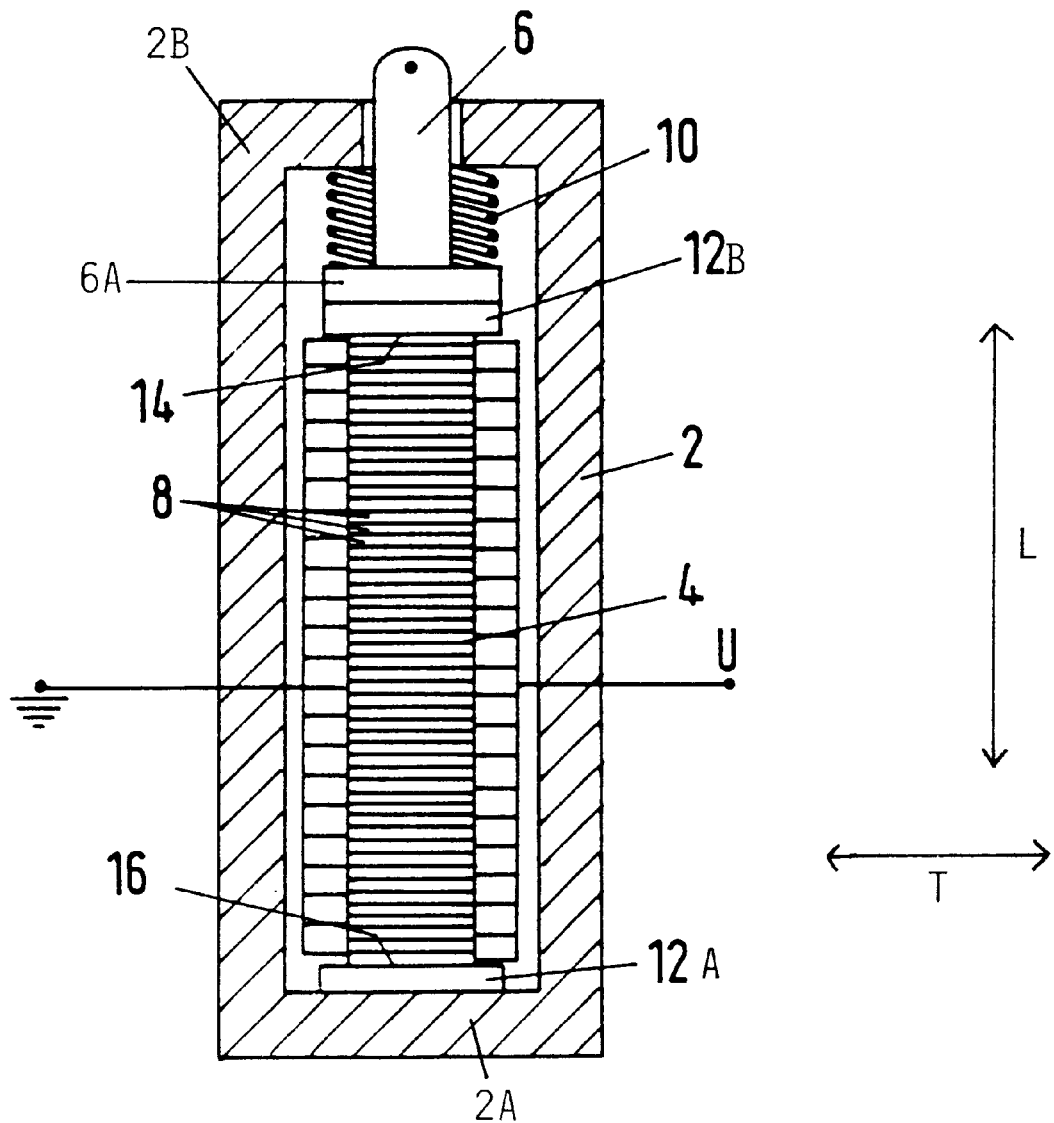
FIG. 1 is a schematic lengthwise section through a piezoelectric actuator device according to the invention.

The actuator device shown in FIG. 1 comprises a device body including an actuator frame or housing 2 as well as an output member or particularly an actuator output pin 6 movably passing through a hole from the interior to the exterior of the actuator housing 2, and an electrostrictive or piezoelectric solid state actuator element 4 arranged between the end wall or floor 2A of the housing 2 and the actuator output pin 6. The solid state actuator element 4 particularly comprises a laminated stack of piezoelectric material layers 8 forming a laminated piezoelectric actuator element 4, which is clampingly held between the actuator output pin 6 and the housing floor 2A. The individual piezoelectric layers 8 of the laminated piezoelectric element 4 are alternately electrically connected to ground or to an actuating voltage U by respective conductors. In this manner, the laminated piezoelectric element 4 is piezoelectrically elongated in the lengthwise direction L while contracting in the transverse direction T upon application of the actuating voltage U.

In order to ensure that the laminated piezoelectric element 4 is held in a state of pre-compression, so as to prevent external tension forces transmitted via the actuator output pin 6 from applying an effective tension on the laminated piezoelectric element 4, a pre-loading spring 10 is arranged between the top end wall 2B of the housing 2 and an end plate 6A of the actuator output pin 6, so as to bias the actuator output pin 6 in a direction for pre-compressing and clampingly holding the laminated piezoelectric element 4 between the end plate 6A of the pin 6 and the floor 2A of the housing 2.

A respective protective interlayer plate 12A or 12B is arranged between the end faces 14 and 16 of the laminated piezoelectric element 4 and the housing floor 2A on the one hand or the actuator pin end plate 6A on the other hand. The respective end faces of the piezoelectric element 4 that transmit the actuation force and form respective actuator contact surfaces 14 and 16 are surfacially connected to the respective adjoining interlayer plate 12B or 12A, over the entire adjoining surface, for example by adhesive bonding or any other known surface bonding technique.

Figure 2:
FIG. 2 is a schematic section through the interlayer plate of the actuator device according to FIG. 1.

As illustrated separately in FIG. 2, each interlayer plate 12A and 12B is fabricated of a fiber composite material with a unidirectional fiber orientation in the lengthwise direction L of the actuator, in such a manner that the mechanical stiffness of the interlayer plates 12A and 12B is significantly higher in the fiber direction, i.e. the lengthwise direction L, and clearly lower in a direction perpendicular thereto, i.e. in the transverse direction T, in comparison to the stiffness of the piezoelectric material making up the piezoelectric element 4. Thus, in this manner it is possible to achieve moduli of elasticity of more than 300 GPa in the fiber lengthwise direction, and of less than 10 GPa transverse to the fiber direction, using a carbon fiber composite material. On the other hand, the modulus of elasticity of the piezoceramic material of the piezoelectric element 4 is approximately 50 GPa, which is roughly the geometric mean of 300 GPa and 10 GPa less 10%.

Due to the high lengthwise stiffness of the interlayer plates 12A and 12B, the piezoelectric elongation forces and elongation travel of the piezoelectric element 4 are transmitted to the actuator output pin 6 essentially without stroke losses. Simultaneously, the relatively low stiffness of the interlayer plates 12A and 12B in the transverse direction T provide a soft or elastic coupling of the contact surfaces 14 and 16 of the piezoelectric element 4 to the end plate 6A of the actuator output pin 6 and to the floor 2A of the actuator housing 2 respectively, with respect to the transverse contraction of the piezoelectric element 4. Thereby, the contact surfaces 14 and 16 of the piezoelectric element 4 are effectively protected against critical transverse tensile stress peaks.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. An actuator device comprising:

an actuator body;

a solid state actuator element comprising a solid state material and having a length in a lengthwise direction that is adapted to be variable responsive to an electrical voltage being applied to said actuator element, wherein said actuator element has two respective ends that are coupled in a force transmitting manner to said actuator body; and at least one protective interlayer arranged between at least one of said ends of said actuator element and said actuator body, wherein said protective interlayer comprises an anisotropic material having an anisotropic modulus of elasticity with a relatively greater lengthwise stiffness in said lengthwise direction and a relatively lesser transverse stiffness in a transverse direction perpendicular to said lengthwise direction.

2. The actuator device according to claim 1, wherein said at least one protective interlayer is adapted to reduce peak transverse loads acting in said transverse direction on said solid state actuator element adjacent said at least one end thereof.

3. The actuator device according to claim 1, comprising two of said protective interlayers arranged respectively between said two ends of said actuator element and said actuator body.

4. The actuator device according to claim 1, wherein a stiffness of said solid state material is between said transverse stiffness and said lengthwise stiffness of said anisotropic material.

5. The actuator device according to claim 4, wherein said solid state material is an electrostrictive material.

6. The actuator device according to claim 4, wherein said solid state material is a piezoelectric ceramic material.

7. The actuator device according to claim 4, wherein a ratio of said lengthwise stiffness relative to said transverse stiffness is greater than 10.

8. The actuator device according to claim 7, wherein said ratio is at least 30.

9. The actuator device according to claim 7, wherein said stiffness of said solid state material is within ±10% of the geometric mean of said lengthwise stiffness and said transverse stiffness.

10. The actuator device according to claim 1, wherein said anisotropic material of said protective interlayer is a fiber-reinforced composite material comprising fibers with a unidirectional orientation parallel to said lengthwise direction.

11. The actuator device according to claim 10, wherein said composite material is a carbon fiber-reinforced composite material.

12. The actuator device according to claim 10, wherein said protective interlayer consists entirely of said fiber-reinforced composite material.

13. The actuator device according to claim 1, wherein a ratio of said lengthwise stiffness relative to said transverse stiffness is greater than 10.

14. The actuator device according to claim 13, wherein said ratio is at least 50.

15. The actuator device according to claim 1, wherein said lengthwise stiffness is greater than 300 GPa, and said transverse stiffness is less than 10 GPa.

16. The actuator device according to claim 1, wherein said protective interlayer does not comprise a piezoelectric material.

17. The actuator device according to claim 1, wherein said solid state material is a piezoelectric material, said solid state actuator element comprises stacked layers of said piezoelectric material, and said protective interlayer is a solid pressure plate of said anisotropic material coupled to said actuator element over an entire surface area of said at least one end of said actuator element.

18. The actuator device according to claim 1, wherein said protective interlayer is surfacially bonded to said at least one end of said actuator element.

19. The actuator device according to claim 1, wherein said actuator body comprises a housing and an actuator pin movably arranged relative to said housing so as to protrude a variable extent from said housing, and said actuator element is arranged within said housing with a first one of said two ends coupled in a force transmitting manner to said housing and a second one of said two ends coupled in a force transmitting manner to said actuator pin.

20. The actuator device according to claim 19, further comprising a biasing spring arranged to bias said actuator pin relative to said housing against said actuator element, so as to clampingly hold said actuator element in a pre-compressed state between said actuator pin and said housing.

* * * * *